United States Patent
Han et al.

(10) Patent No.: US 8,242,003 B1
(45) Date of Patent: Aug. 14, 2012

(54) DEFECT REMOVAL IN GE GROWN ON SI

(75) Inventors: Sang M. Han, Albuquerque, NM (US);
Darin Leonhardt, Albuquerque, NM (US)

(73) Assignee: STC.UNM, Albuquerque, NM (US)

(*) Notice: Subject to any disclaimer, the term of this patent is extended or adjusted under 35 U.S.C. 154(b) by 0 days.

(21) Appl. No.: 13/087,240

(22) Filed: Apr. 14, 2011

Related U.S. Application Data

(60) Provisional application No. 61/342,457, filed on Apr. 14, 2010.

(51) Int. Cl.
*H01L 21/20* (2006.01)
*H01L 21/36* (2006.01)
(52) U.S. Cl. ........ 438/493; 438/423; 438/481; 438/507; 257/E21.335; 257/E21.346
(58) Field of Classification Search .............. 438/493, 438/481, 603, 607, 207; 257/E21.335, E21.346; 117/87, 88, 94, 95, 97
See application file for complete search history.

(56) References Cited

U.S. PATENT DOCUMENTS

| | | | | |
|---|---|---|---|---|
| 7,250,360 B2* | 7/2007 | Shealy et al. | .................. | 438/603 |
| 7,445,673 B2* | 11/2008 | Beaumont et al. | .............. | 117/94 |
| 7,517,776 B2* | 4/2009 | Xie et al. | ..................... | 438/511 |
| 7,579,263 B2 | 8/2009 | Han et al. | | |

OTHER PUBLICATIONS

Cederberg, Jeffrey C. et al., "GaAs/Si epitaxial integration utilizing a two-step, selectively grown Ge intermediate layer," Journal of Crystal Growth, 312, 2010, pp. 1291-1296.

Li, Qiming et al., "Heteroepitaxy of high-quality Ge on Si by nanoscale Ge seeds grown through a thin layer of SiO2," Applied Physics Letter, vol. 85, No. 11, Sep. 13, 2004, pp. 1928-1930.

Leonhardt, Darin et al., "Nanoscale interfacial engineering to grow Ge on Si as virtual substrates and subsequent integration of GaAs," Thin Soild Films, 518, 2010, pp. 5920-5927.

Li, Qiming et al., "Morphological evolution and strain relaxation of Ge islands grown on chemically oxidized Si(100) by molecular-beam epitaxy," Journal of Applied Physics, 98, 073504, 2005, pp. 1-8.

Shklyaev, Alexander A. et al., "High-density ultrasmall epitaxial Ge islands on Si(111) surfaces with a SiO2 coverage," Physical Review B, vol. 62, No. 3, Jul. 15, 2000, pp. 1540-1543.

Tromp, G. et al., "High-Temperature SiO2 Decomposition at the SiO2/Si Interface," Physical Review Letters, vol. 55, No. 21, Nov. 18, 1995, pp. 2332-2335.

\* cited by examiner

*Primary Examiner* — Charles Garber
*Assistant Examiner* — Abdulfattah Mustapha
(74) *Attorney, Agent, or Firm* — MH2 Technology Law Group LLP

(57) ABSTRACT

Exemplary embodiments provide methods of forming semiconductor devices, by which defects formed upon nucleation and coalescence of semiconductor islands can be reduced or eliminated. In one embodiment, an annealing process can be performed prior to coalescence of the semiconductor islands into a continuous semiconductor layer. In another embodiment, high-quality Group III-V materials can be formed on the continuous semiconductor layer.

20 Claims, 4 Drawing Sheets

DEFECT REMOVAL IN GE GROWN ON SI

RELATED APPLICATIONS

This application claims priority to U.S. Provisional Patent Application Ser. No. 61/342,457, filed Apr. 14, 2010, which is hereby incorporated by reference in its entirety.

GOVERNMENT RIGHTS

This disclosure was made with Government support under Contract No. DMR-0907112 awarded by the National Science Foundation, Contract No. FA9453-06-C-0211 awarded by the Air Force Research Laboratory, and Contract No. SPAS 30302 awarded by the State of New Mexico—New Mexico Technology Research Collaborative. The Government has certain rights in the invention.

BACKGROUND

High-quality germanium (Ge) on silicon (Si) continues to be of interest for many notable applications. Specifically, Ge on Si can be used as substrates for III-V integration to fabricate multijunction solar cells, high-carrier-mobility field effect transistors, high-speed heterojunction bipolar transistors, infrared detectors, etc. However, the main difficulty in achieving high-quality Ge is the 4.2% lattice mismatch and 116% thermal expansion coefficient (TEC) mismatch between Ge and Si. The lattice mismatch results in high threading dislocation densities (TDDs) on the order of $10^8$-$10^9$ cm$^{-2}$, while the TEC mismatch leads to microcracks in Ge films thicker than 5 μm as the substrate cools from a growth temperature to room temperature. Conventional attempts to reduce the defect density in Ge on Si include using graded Ge$_x$Si$_{1-x}$ buffer layers, cyclical thermal annealing, strained-layer blocking, small-area mesas, and aspect ratio trapping.

Conventional methods for forming Ge on Si include exposure of an ultrathin SiO$_2$ layer on Si to a Ge flux, which results in a nucleation of over $10^{11}$ cm$^{-2}$ epitaxial Ge dots. The Ge dots are shown to nucleate within tiny openings in the SiO$_2$ layer (see Shklyaev, et. al, Phys. Rev. B 62, 2000, 1540). Ge beam and Si substrate participate in the decomposition reaction of SiO$_2$ to form volatile byproducts of SiO and GeO (see Leonhardt, et. al., Thin Solid Films 518, 2010, 5920). Tromp et al. observed that the erosion of SiO$_2$ does not occur uniformly, but rather at random locations that likely involve defects at the Si—SiO$_2$ interface (see Tromp, et. al., Phys. Rev. Lett. 55, 1985, 2332). One possible defect is dangling bond defects, known as $P_{bO}$ detectable by electron spin resonance spectroscopy. The reported density of $P_{bO}$ interfacial defects is on the order of $10^{12}$ cm$^{-2}$, which is close to the number of openings in the SiO$_2$ where Ge nuclei form (see Leonhardt, et. al., Thin Solid Films 518, 2010, 5920; Li, et. al., J. Appl. Phys. 98, 2005, 73504; Li, et. al., Appl. Phys. Lett. 85, 2004, 1928; and Shklyaev, et. al., Phys. Rev. B 62, 2000, 1540).

Although the technique of using Ge nucleation through nanometer openings in SiO$_2$ generates low TDD Ge films on Si, a high stacking fault (SF) density of about 5×$10^7$ cm$^{-2}$ is generated at the surface of the Ge film (see Leonhardt, et. al., Thin Solid Films 518. 2010, 5920). Upon polishing the coalesced Ge film with a non-slurry-based solution, these SFs manifest themselves as protruding lines along <110> directions raised 1-2 nm above the surrounding, polished Ge film surface. These SFs cause significant surface roughness and lead to non-radiative recombination centers in GaAs that is subsequently grown on Ge/SiO$_2$/Si virtual substrates (see Leonhardt, et. al., Thin Solid Films 518, 2010, 5920 and Cederberg, et. al., J. Cryst. Growth 312, 2010, 1291).

Thus, there is a need to overcome these and other problems of the prior art and to provide methods for reducing or eliminating defects when forming semiconductor layers/devices by nucleation and coalescence.

SUMMARY

According to various embodiments, the present teachings include a method of forming a semiconductor device by providing a template layer on a substrate. The template layer can be exposed to a semiconductor material to form a plurality of nanoscale windows and subsequently semiconductor islands on the substrate through the template layer. Each semiconductor island of the plurality of semiconductor islands can cover a portion of a top surface of the template layer and can be annealed at a temperature of at least about 900 K prior to a coalescence of the plurality of the semiconductor islands into a continuous semiconductor layer.

According to various embodiments, the present teachings also include a method of forming a semiconductor device by first providing a template layer on a substrate. The template layer can then be exposed to a semiconductor material to form a plurality of nanoscale windows and subsequently semiconductor islands on the substrate through the template layer with each semiconductor island covering a portion of a top surface of the template layer. The plurality of semiconductor islands can be annealed at a temperature of at least about 900 K, prior to coalescence of the plurality of semiconductor islands into a continuous semiconductor layer. The annealing process can remove an uncovered portion of the template layer and expose a portion of the substrate. Following the annealing process, the plurality of semiconductor islands can be laterally grown into the continuous semiconductor layer to cover the exposed portion of the substrate, wherein the annealing process can reduce or eliminate defects generated in the continuous semiconductor layer.

According to various embodiments, the present teachings further include a method of forming a semiconductor device by first providing a template layer on a substrate; and then exposing the template layer to a semiconductor material to form a plurality of nanoscale windows and subsequently semiconductor islands on the substrate through the template layer. Each semiconductor island of the plurality of semiconductor islands can cover a portion of a top surface of the template layer and can be annealed at a temperature of at least about 900 K prior to coalescence of the plurality of semiconductor islands into a continuous semiconductor layer. An uncovered portion of the template layer can be removed due to the annealing process to expose a portion of the substrate. An interfacial layer can then be formed on the exposed portion of the substrate, followed by laterally growing the plurality of semiconductor islands into the continuous semiconductor layer to cover the interface layer. The continuous semiconductor layer can be formed with reduced stacking faults and threading dislocations.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate several embodiments of the present teachings and together with the description, serve to explain the principles of the invention.

DESCRIPTION OF THE EMBODIMENTS

Reference will now be made in detail to exemplary embodiments of the present teachings, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

Exemplary embodiments provide methods of forming semiconductor devices, by which defects formed upon nucleation and coalescence of semiconductor islands can be reduced or eliminated. For example, defects including stacking faults (SFs) and/or threading dislocations (TDs) can be reduced or eliminated upon annealing the semiconductor islands prior to a complete coalescence of the semiconductor islands.

FIGS. 1A-1D depict an exemplary method of forming a semiconductor device in accordance with various embodiments of the present teachings.

Figure 1A:
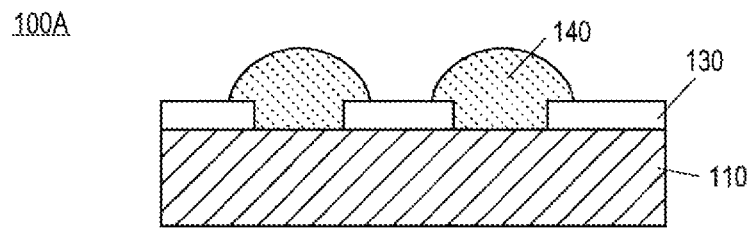
FIGS. 1A-1D depict an exemplary method of forming a semiconductor device in accordance with various embodiments of the present teachings.

In FIG. 1A, the device 100A can include a template layer 130 formed on a substrate 110, and a plurality of semiconductor islands 140 interspersed through the template layer 130 and on the substrate 110.

In embodiments, the substrate 110 can be, for example, a silicon substrate. The template layer 130 can be, for example, an oxide layer such as a chemically oxidized $SiO_2$ layer. Other template materials can include, but are not limited to, silicon nitride, silicon oxynitride, anodized aluminum Oxide (AAO), and/or other oxides. In embodiments, the template layer 130 can be an amorphous material. The template layer 130 can have a thickness ranging from about 1 Å to about 30 Å, although the thickness is not limited.

In one embodiment, to form the semiconductor device, a template layer 130 on a substrate 110 can firstly be provided. For example, the template layer on the substrate can initially be an un-patterned $SiO_2$ layer that is chemically oxidized from a Si substrate. The template layer 130 can then be exposed to a semiconductor material to form a plurality of nanoscale windows in the template layer 130, exposing the substrate 110, and to subsequently form the semiconductor islands 140 in the nanoscale windows and on the substrate 110, i.e., through the patterned template layer 130. Each semiconductor island 140 can be formed to further cover a portion of the top surface of the patterned template layer 130 as shown in FIG. 1A.

In embodiments, the semiconductor islands 140 can be formed of a material including, for example, germanium (Ge), GaAs, InP, and/or GaN. The semiconductor islands 140 can be lattice-mismatched with the substrate 110. In embodiments, the semiconductor islands 140 can be formed from coalescence of smaller islands. Semiconductor islands can have at least one dimension of about 200 nm or less. In some cases, the dimension of the semiconductor islands 140 can be about 100 nm or less, for example, ranging from about 2 nm to about 8 nm. Adjacent semiconductor islands 140 can have an average center-to-center spacing ranging from about 2 nm to about 1 μm, or from about 2 nm to about 500 nm. Alternatively, the semiconductor islands 140 can have an average initial island density of less than $1E12\ cm^{-2}$, for example, ranging from about $1E7\ cm^{-2}$ to about $1E12\ cm^{-2}$.

In one embodiment, each semiconductor island 140 can be laterally grown, e.g., epitaxially deposited, on the substrate 110 out of an opening in the template layer 130 to cover a corresponding surface portion of the template layer 130. The opening can have a width or diameter of about 1 nm to about 20 nm, such as about 3 nm to 7 nm. For example, the semiconductor islands 140 can be formed by a self-directed touch-down method as disclosed in U.S. Pat. No. 7,579,263, entitled "Threading-Dislocation-Free Nanoheteroepitaxy of Ge on Si using Self-Directed Touch-Down of Ge through a Thin $SiO_2$ Layer," the disclosure of which is incorporated herein by reference in its entirety. The term "self-directed touchdown" refers to a nucleation and growth process that is initiated without reliance-on a photolithographic mask to pattern a substrate or other layer.

In exemplary embodiments, the template layer 130 can be a chemically oxidized silicon layer, the substrate 110 can be a silicon substrate, and the semiconductor islands 140 can be Ge islands, although the materials and methods used for the device 100A are not limited. For example, upon exposing the chemical $SiO_2$ layer to a Ge flux, Ge islands can be formed by nucleation and successive coalescence of Ge materials grown out of the openings in the chemical $SiO_2$ layer on the Si substrate. In embodiments, the semiconductor islands can have a deposition rate or an exemplary Ge flux ranging from $1E12$ atoms/$cm^2$-s to about $1E16$ atoms/$cm^2$-s, such as about $1.9E14$ atoms/$cm^2$-s. Multiple coalescence events can occur to provide large Ge islands, e.g., having a diameter up to about 200 nm. As exposure to Ge continues, for example, by molecular beam epitaxy, the Ge islands can then laterally overgrow and coalesce over corresponding surface portions of the chemical $SiO_2$ template layer. During this course, the island density can decrease due to the coalescence, and the semiconductor islands can contain SFs.

Figure 1B:
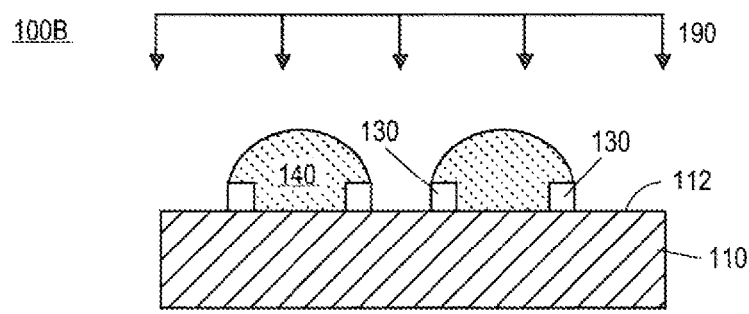

In FIG. 1B, prior to a complete coalescence of the laterally over-growing semiconductor islands 140, an annealing process 190 can be performed to reduce or eliminate the exemplary defects, such as SFs.

As disclosed herein, the term "complete coalescence" refers to a lateral over-growth of each of the semiconductor islands 140 such that adjacent semiconductor islands are merged to form a continuous semiconductor film/layer over the substrate 110. The annealing process can therefore be performed during an initial growth of the semiconductor islands 140 on the substrate 110, during a lateral overgrowth of the semiconductor islands 140 that partially covers a surface portion of the template layer 130, and/or during merging of adjacent semiconductor islands 140 but prior to a complete coalescence to form a continuous semiconductor layer. Defects such as SFs can be annealed out.

In embodiments, the annealing process can be performed at a temperature of at least about 900 K, for example, ranging from about 900 K to about 1211 K such as about 1073 K, for a time length of at least about 15 minutes, for example about 15 minutes to about 60 minutes such as about 30 minutes, although the process is not limited.

Conventional methods for coalescing islands to form semiconductor layer do not include an annealing process as disclosed herein. Consequently, coalescence defects, such as SFs and/or TDs, are generated in the coalesced semiconductor layer or at the interface between the semiconductor layer and its adjacent layers in the conventional methods.

In embodiments, as also shown in FIG. 1B, the annealing process 190 can remove (or desorb) the uncovered portion of the template layer 130. Corresponding substrate surface 112 can then be exposed. One the other hand, the covered portions of the template layer 130 that are buried beneath these semiconductor islands 140 can remain intact during the annealing process 190.

Figure 1C:
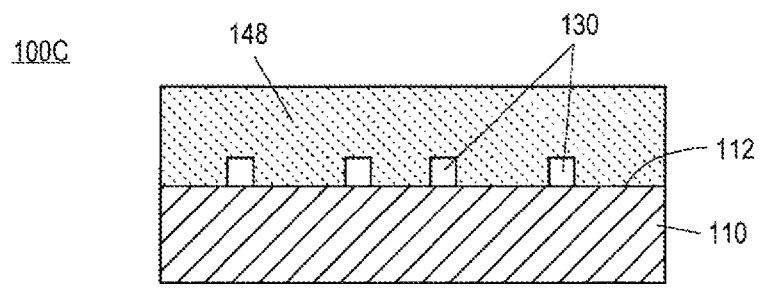

In FIG. 1C, following the annealing process, the coalescence/growth of the semiconductor islands 140 can be continued to form a continuous semiconductor layer 148. The growth of the semiconductor islands can occur directly on the formed islands shown in FIG. 1B and on the exposed substrate surface portion 112.

Because of the disclosed annealing process, the coalesced semiconductor layer 148/140 can be a low-defect-density single crystalline epitaxial layer, for example, having few or no stacking faults (SFs). Because of the annealing process, the lattice mismatched semiconductor layer 148 on the substrate 110 also can have a reduced threading dislocation density.

In embodiments, prior to further processing, a polishing process can be applied to the annealed semiconductor layer 148 of FIG. 1C to provide a desirable surface for the subsequent formation, such as, for example, a further growth of Ge and/or an integration of Group III-V materials. In an exemplary embodiment, a chemical mechanical planarization (CMP) process can be performed using a solution that includes hydrogen peroxide ($H_2O_2$) but is free of particles, such as silica particles or alumina particles. In embodiments, following the CMP process, the semiconductor layer 148 can be cleaned and/or passivated using various agents including, for example, one or more of HF, HCl, $H_2O_2$, DI water, and/or plasma.

Figure 1D:
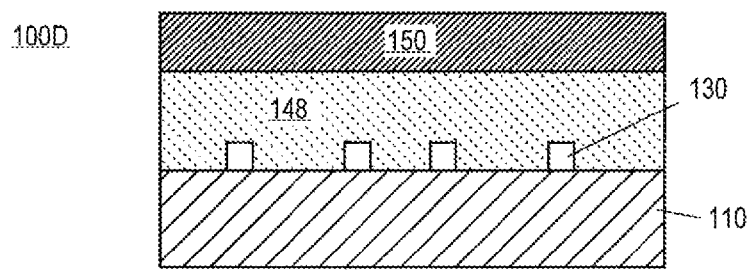

In embodiments, the semiconductor device can further include one or more additional semiconductor layers. For example, a Group III-V layer 150 can be formed over the semiconductor layer 148 as shown in FIG. 1D in accordance with various embodiments of the present teachings.

Exemplary Group III-V materials used for the layer 150 can include, but are not limited to, GaAs, AlGaAs, AlAs, InAs, GaN, AlN, InN, InGaAs, AlGaAs, and/or AlInGaAs. In embodiments, the Group III-V layer, along with the semiconductor islands 140/the semiconductor layer 148, can be formed by various crystal growth techniques including, but not limited to, metal-organic chemical vapor deposition (MOCVD), molecular-beam epitaxy (MBE), gas source MBE (GSMBE), metal-organic MBE (MOMBE), atomic layer epitaxy (ALE), and/or hydride vapor phase epitaxy (HVPE).

Due to the disclosed annealing process 190 prior to the full coalescence of the semiconductor layer 148, the formed Group III-V layer 150 can have an improved surface roughness and cathodoluminescence (CL), and a reduced TDD, as compared with the same layer formed without using the annealing process. For example, the Group III-V layer 150 can have a root-mean-square (RMS) roughness of about 2 nm or greater, e.g., ranging from about 2 nm to about 50 nm, or ranging from about 2 nm to about 40 nm, although not limited.

In embodiments, the deposition/growth occurring on the exposed substrate surface 112 can lead to a large number of threading dislocations (TDs) to relieve the lattice mismatch stress between the semiconductor material (e.g., Ge) grown directly on the substrate (e.g., Si). Most of the dislocations can terminate within a tangled network close to the exemplary Si—Ge interface (see 112 in FIG. 1C) or occasionally with few toward the surface of the exemplary Ge layer (see 148 in FIG. 1C). In one embodiment, the TDD within the middle of the Ge film can be about $2 \times 10^7$ cm$^{-2}$.

In embodiments, TDs can be removed by forming an interfacial layer between the mismatched materials. For example, FIGS. 2A-2E depict another exemplary method for forming a defect-free semiconductor device in accordance with various embodiments of the present teachings. As compared with the method depicted in FIGS. 1A-1D, the method 200 can include forming an interfacial layer 235 after the partial removal of the template layer 130 (i.e., due to the annealing process 190 depicted in FIG. 1B) and prior to the continued formation of the semiconductor layer 148.

Figure 2A:
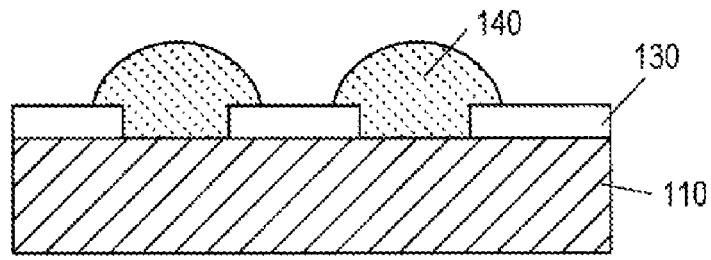
FIGS. 2A-2E depict another exemplary method of forming a semiconductor device in accordance with various embodiments of the present teachings.
Figure 2B:
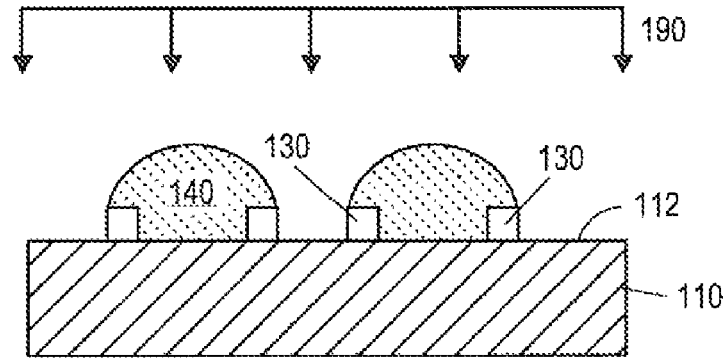

Specifically, FIGS. 2A-2B can provide devices 200A-200B as similarly depicted in FIGS. 1A-1B. For example, in FIG. 2A, a plurality of semiconductor islands 140 (e.g., Ge islands) can be formed with each island grown out of an opening in a template layer 130, on a substrate 110, and covering a corresponding surface portion of the template layer 130. In FIG. 2B, the exemplary Ge islands can be annealed at a temperature of at least about 1073 K, prior to forming a complete coalescence of the exemplary Ge islands. The annealing process 190 can remove those uncovered portion of the template layer 130 to expose a corresponding surface portion 112 of the substrate 110, and leave the covered portions remain intact. The annealing process 190 can anneal out SFs.

Figure 2C:
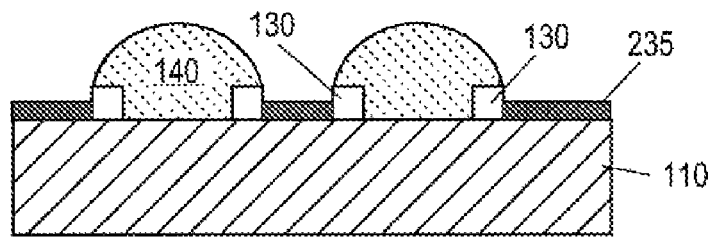
Figure 2D:
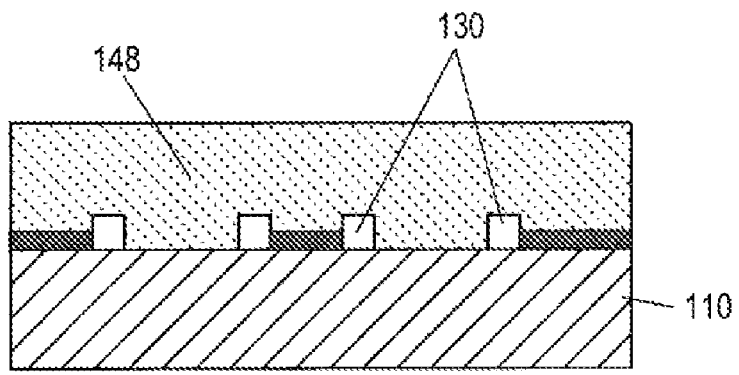
Figure 2E:
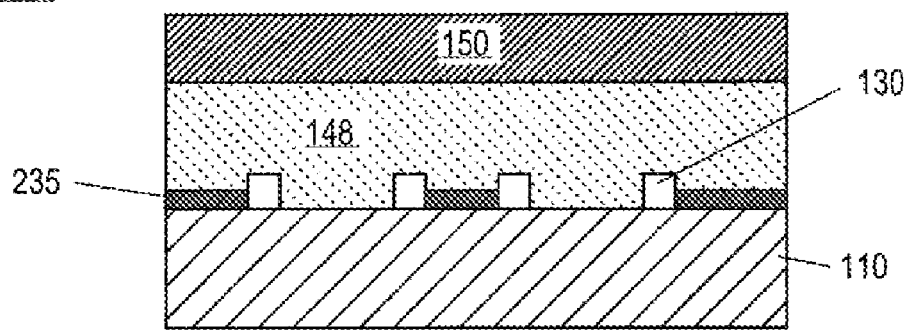

In FIG. 2C, an interfacial layer 235, for example, an oxide layer as for the template layer 130 or other suitable layers, can be formed on the exposed substrate surface 112. In FIG. 2D, the lateral coalescence/growth of the semiconductor islands 140 can be continued to form a continuous semiconductor layer 148 covering the entire surface of the device 200C including the exposed substrate surface portion 112. In FIG. 2E, a Group III-V layer 150 can be formed on the semiconductor layer 148 with high quality.

The formation of the interfacial layer 235 after the annealing as depicted in FIG. 2C can relieve the lattice mismatch stress between the semiconductor material (e.g., Ge) grown directly on the substrate 110 (e.g., Si) as seen in FIG. 1C. The generation of TDs at the interface can then be minimized due to strain relaxation.

In embodiments, the semiconductor layer 148 formed on the substrate 110 in FIGS. 1C-1D and/or FIGS. 2D-2E can have a thickness ranging from about 2 nm to about 5 μm without forming microcracks in the semiconductor layer 148 such as a Ge film, although the thickness is not limited.

The following examples primary relate to formation of an exemplary semiconductor layer of Ge with high quality on Si substrate by an annealing process and the formation of other related devices in accordance with various embodiments of the present teachings.

EXAMPLES

Example 1

Preparation of Ge/SiO$_2$ Template/Si

Germanium was grown using molecular beam epitaxy (MBE). The growth chamber including flux and substrate heater calibration was used as described in a related publication of Thin Solid Films 518 (2010) 5920, entitled "Nanoscale Interfacial Engineering to Grow Ge on Si as Virtual Substrates and Subsequent Integration of GaAs." Si(100) substrates were boron-doped with a resistivity of about 1-10 O-cm. The Si substrates were cleaned and chemically oxidized for about 5 minutes in a Piranha bath including 3 volumetric parts of $H_2SO_4$ (96 wt % and 1 part of $H_2O_2$ (30 wt %). The Piranha bath was heated to about 373 K for consistency of chemically grown $SiO_2$ and its quality. The samples were subsequently dipped into a buffered oxide etch solution (20 parts 40 wt % $NH_4F$: 1 part 49 wt % HF) diluted in deionized (DI) water by 1:6 (etchant to water) volumetric ratio to remove the chemical oxide. The chemical oxidation was then repeated, and the wafer was rinsed in DI water and blown dry with $N_2$. The final chemical oxidation step was previously shown to result in a chemical oxide layer of about 1.4 nm thickness. After being loaded into the deposition chamber, the samples were degassed at about 853 K for about 10 minutes. The effusion cell temperature was set to produce a flux of about $1.9 \times 10^{14}$ atoms/cm²-s (19.1 ML/min) and allowed to stabilize for about 30 minutes. The shutter was subsequently opened for about 54 second of deposition and then closed. An amount equivalent to 10 nm of Ge was deposited during this step, assuming that all incident Ge flux adhered to the substrate layer by layer as a film. However, this exposure left Ge islands only partly coalesced over the remaining chemical $SiO_2$ template and did not form a continuous film.

The substrate heater was then increased to about 1073 K for about 30 minutes for the high temperature anneal. After lowering and stabilizing the substrate temperature to about 853 K, the deposition rate was increased to about 60 ML/min to achieve a final film thickness of about 3.5 µm. The pressure in the chamber remained below $1.3 \times 10^{-6}$ Pa during the deposition.

Example 2

Ge Deposition and Island Density

The density of Ge islands that form upon exposing the chemical $SiO_2$ on Si to Ge flux was collected at increasing amounts of Ge deposition, e.g., after 8, 12, 18, and 25 nm of Ge deposition, through a series of high-resolution SEM images to calculate average Ge islands density and extent of Ge island coalescence.

During the layer on layer deposition of Ge using Ge flux, the substrate temperature was held at 853 K, and the Ge flux is maintained at 19.1 ML/min (Set 1). As the thickness of the deposited Ge layer increased, the island density decreased. At 8 nm deposition, the Ge island density was about $2.6 \pm 0.2 \times 10^{11}$; and at 12 nm deposition, the Ge island density was about $1.4 \pm 0.2 \times 10^{11}$ cm$^{-2}$, indicating each island coalesced with its neighbors between deposition of 8 nm and 12 nm of Ge deposition. At 18 nm of Ge deposition, the island density was nearly unchanged at $1.2 \pm 0.1 \times 10^{11}$ cm$^{-2}$ indicating that islands grow without further coalescence between 12 nm and 18 nm of Ge deposition. At 25 nm of Ge deposited, the island density further decreased to $3.2 \pm 0.1 \times 10^{10}$ cm$^{-2}$ indicating that four coalescence events per island have occurred.

For comparison, two additional sets of samples were prepared after the same Ge exposure levels (i.e., at about 8, 12, 18, and 25 nm). Set 2 was made at a substrate temperature that was 70 degrees higher at 923 K and at the same deposition rate of 19.1 ML/min. Set 3 was made at the same substrate temperature of about 853 K as that of the first set, but at a higher deposition rate of about 60 ML/min. The samples of Set 2 made at the higher substrate temperature showed the same maximum island density as for Set 1 of about $2.6 \pm 0.2 \times 10^{11}$ cm$^{-2}$, occurring at both 8 nm and 12 nm of Ge deposition. Island coalescence then decreased the island density to about $7.1 \pm 0.1 \times 10^{10}$ cm$^{-2}$ and about $5.9 \pm 0.1 \times 10^{10}$ cm$^{-2}$ for the 18 nm and 25 nm of Ge deposition, respectively. These island densities were higher for the same amount of Ge deposition compared to the samples made at the lower temperature of about 853 K, indicating that coalescence was suppressed at higher temperature. This can be explained by increased surface diffusion at the higher temperature, thus allowing Ge islands to achieve a greater contact angle with the surrounding $SiO_2$ and leading to larger spacing between Ge islands.

The island densities in the samples made at the higher deposition rate (Set 3) were all identical to those found in the series shown in Set 1, with the maximum island density of $2.6 \pm 0.2 \times 10^{11}$ cm$^{-2}$ occurring after 8 nm of deposition.

Example 3

Annealing Process

SFs in Ge manifested themselves at the Ge surface after chemical polishing as straight or L-shaped, protruding lines. During chemical mechanical planarization (CMP), the Ge film near the region of SFs polished at a slightly reduced rate compared to the surrounding material. This reduced polish rate resulted in lines of SFs approximately 1 µm long, 100 nm wide, and 1 nm to 2 nm high. The lines extended along <110> directions and had a surface density of about $5 \times 10^7$ cm$^{-2}$.

In comparison, SFs did not manifest themselves if an anneal step was done for about 30 minutes at 1073 K on Ge islands before extensive coalescence to form a continuous Ge film. Anneal temperatures below 1073 K for 30 minutes were found to be ineffective at completely removing the SFs. When the anneal step was performed for about 30 minutes at temperatures of about 923 K, 1003 K, and 1073 K after deposition of 10 nm of Ge on the oxidized Si at 853 K, but before full Ge coalescence to form a continuous film (up to about 3 µm thick), the density and dimensions of SF lines decreased with increasing annealing temperature, until at 1073 K, SF lines were no longer detectable.

Figure 3:
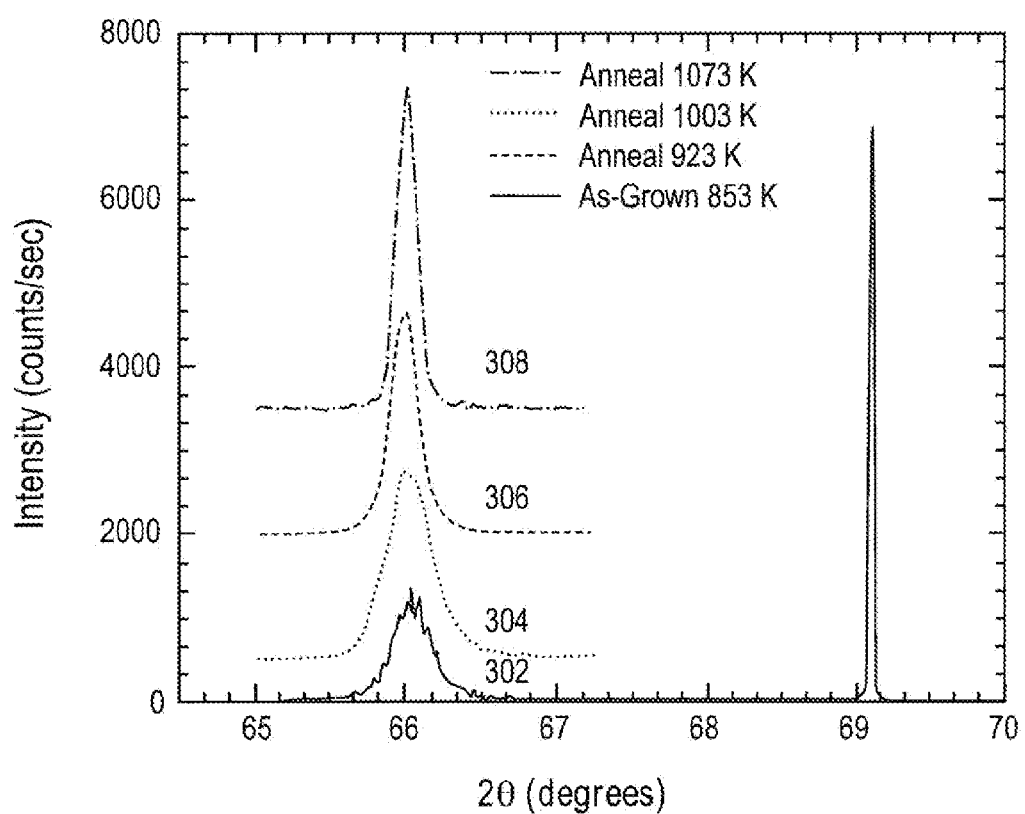
FIG. 3 depicts x-ray diffraction (XRD) peaks of various exemplary Ge films in accordance with various embodiments of the present teachings.

Correspondingly, FIG. 3 depicts x-ray diffraction (XRD) full-width-at-half-maximum (FWHM) peaks of the (004) reflection of exemplary Ge films that are unannealed (see 302), annealed at 923 K (see 304), at 1003 k (see 306), and at 1073 K (see 308) for about 30 minutes after first depositing 10 nm of Ge. FIG. 3 shows that the XRD of the (004) reflection of the Ge film decreased by a factor of 2.3 as compared to unannealed films. The FWHM of the (331) reflection (not shown) decreased even further, by a factor of 3.3. These results indicate that SFs were removed, and the crystal quality of the Ge films significantly improved during the 1073 K anneal that was performed during the island stage of Ge growth.

Annealing at 1073 K was also conducted at different stages of Ge island coalescence. Two samples were created, Sample 1 with 50 nm and Sample 2 with 100 nm of Ge deposition. Significant Ge island coalescence had occurred on both samples and some islands were observed with SEM to be over 200 nm in diameter; however, the Ge islands still did not form a continuous film across the surface. The samples were then annealed at 1073 K for about 30 minutes, followed by further Ge growth to about 3 µm thickness. In both cases, SF lines were not observed in the Ge films. In contrast, films annealed at 1073 K for about 30 minutes after complete coalescence resulted in SFs remaining in the Ge film.

Example 4

Group III-V Layers Formed on Ge/SiO$_2$ Template/Si

Ge/SiO$_2$ template/Si samples was polished using a Logitech PM5 lapping/polishing machine on a Logitech Chemcloth polishing pad. The polishing solution included 50 parts DI water and 1 part 30 wt % H$_2$O$_2$. The wafers were then rinsed in DI water and cleaned for about 10 minutes in a capacitively coupled plasma reactor operating at about 250 watts and 1 Torr with about 30 sccm (i.e., standard cubic centimeters per minute) O$_2$ flow rate.

The integration of III-V layers including GaAs and AlGaAs was performed at National Renewable Energy Laboratory (NREL) and at Sandia National Laboratories (SNL). The NREL growth included a 10-period superlattice of GaAs and Al$_{0.2}$Ga$_{0.8}$As layers. The first layer was GaAs, and each layer was about 50 nm thick except for the last 100 nm thick Al$_{0.2}$Ga$_{0.8}$As layer. This was followed by 1500 nm of GaAs, 200 nm of Al$_{0.2}$Ga$_{0.8}$As, and finally a 10 nm thick GaAs cap. The III-V growth performed at NREL was conducted in an atmospheric pressure MOVPE reactor, using trimethylgallium (TMG), trimethylaluminum (TMA), and arsine delivered in H$_2$. The samples were first annealed at about 973 K for two minutes under 1.2 Pa of arsine. The temperature was then reduced to about 923 K for growth. All Al$_{0.2}$Ga$_{0.8}$As layers were grown at a rate of about 2.3 µm/hr and V/III inlet ratio of about 70. All GaAs layers were grown at about 1.8 µm/hr, with V/III inlet ratio of about 86.

The SNL growth stack included about 50 nm of GaAs, about 100 nm of Al$_{0.2}$Ga$_{0.8}$As, and followed by 1000 nm of GaAs. The III-V growth performed at SNL was done using metal-organic vapor phase epitaxy (MOVPE) in a Veeco D125 system. Immediately before GaAs growth, the wafers were rinsed in DI water followed by a 30-second dip in a dilute HF solution (1 part 49 wt. % HF: 100 parts DI water). The wafers were first degassed at 373 K for 30 minutes and then heated to 973 K to remove Ge surface oxide. The growth precursors trimethylaluminum (TMA), trimethylgallium (TMG), and arsine were delivered in an H$_2$ ambient. For AlGaAs growth, the deposition occurred at 923 K with partial pressures of about 0.9 mTorr TMA, about 2.1 mTorr TMG, and about 0.4 Torr arsine. Control samples for NREL and SNL III-V growth included 2-inch 6° offcut Ge substrates manufactured by AXT and were Ga doped to a resistivity of about 0.016-0.022 O-cm.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

What is claimed is:

1. A method of forming a semiconductor device comprising:
    providing a template layer on a substrate, the template layer comprising a top surface;
    exposing the template layer to a semiconductor material to form a plurality of nanoscale windows through the template layer to expose a plurality of portions of the substrate, and to subsequently form a plurality of semiconductor islands in each one of the plurality of nanoscale windows on a corresponding portion of the substrate;
    continuing the exposure to the semiconductor material to grow each semiconductor island of the plurality of semiconductor islands to cover a portion of the top surface of the template layer; and
    annealing the plurality of semiconductor islands at a temperature of at least about 900 K prior to coalescence of the plurality of the semiconductor islands into a continuous semiconductor layer.

2. The method of claim 1, further comprising annealing the plurality of semiconductor islands at the temperature of about 1073 K for about 30 minutes.

3. The method of claim 1, further comprising continuing the exposure of the semiconductor material to the plurality of the semiconductor islands following the annealing step to form the continuous semiconductor layer on the substrate.

4. The method of claim 3, wherein the continuous semiconductor layer is formed without microcracks on the substrate having a thickness ranging from about 2 nm to about 5 µm.

5. The method of claim 1, wherein the patterned template layer has a thickness ranging from about 1 Å to about 30 Å.

6. The method of claim 1, wherein the step of exposing the template layer to the semiconductor material comprises a deposition rate of the semiconductor material ranging from about 1E12 atoms/cm$^2$-s to about 1E16 atoms/cm$^2$-s.

7. The method of claim 1, wherein each semiconductor island of the plurality of semiconductor islands has at least one dimension of less than about 200 nm.

8. The method of claim 1, wherein the plurality of semiconductor islands has an average initial island density ranging from about 1E7 cm$^{-2}$ to about 1E12 cm$^{-2}$.

9. The method of claim 1, wherein the template layer is formed of a material selected from the group consisting of silicon oxide, silicon nitride, silicon oxynitride, anodized aluminum oxide (AAO) and combinations thereof.

10. The method of claim 1, wherein the substrate is Si and the semiconductor material is Ge.

11. A method of forming a semiconductor device comprising:
providing a template layer on a substrate, the template layer comprising a top surface;
exposing the template layer to a semiconductor material to form a plurality of nanoscale windows through the template layer to expose a plurality of portions of the substrate, and to subsequently form a plurality of semiconductor islands in each one of the plurality of nanoscale windows on a corresponding portion of the substrate;
continuing the exposure to the semiconductor material to grow each semiconductor island of the plurality of semiconductor islands to cover a portion of the top surface of the template layer;
annealing the plurality of semiconductor islands at a temperature of at least about 900 K prior to coalescence of the plurality of the semiconductor islands into a continuous semiconductor layer, wherein an uncovered portion of the patterned template layer is removed to expose a second portion of the substrate; and
laterally growing the plurality of semiconductor islands into the continuous semiconductor layer to cover the exposed second portion of the substrate, wherein the annealing reduces defects generated in the continuous semiconductor layer.

12. The method of claim 11, further comprising annealing the plurality of semiconductor islands at the temperature of about 1073 K for about 30 minutes.

13. The method of claim 11, wherein each semiconductor island of the plurality of semiconductor islands has at least one dimension of less than about 200 nm.

14. The method of claim 11, further comprising forming a Group III-V layer on the continuous semiconductor layer, wherein the annealing reduces a root-mean-square (RMS) roughness of the Group III-V layer of about 2 nm or greater.

15. The method of claim 14, further comprising planarizing the continuous semiconductor layer prior to forming the Group III-V layer.

16. The method of claim 14, wherein the Group III-V layer comprises one or more materials selected from the group of GaAs, AlGaAs, AlAs, InAs, GaN, AlN, InN, InGaA, AlGaAs, AlInGaAs, and combinations thereof.

17. The method of claim 14, further comprising using molecular beam epitaxy (MBE) to form the plurality of semiconductor islands and the semiconductor layer; and using metal-organic chemical vapor deposition (MOCVD) to form the Group III-V layer.

18. The method of claim 11, wherein each of the semiconductor material, the plurality of semiconductor islands, and the continuous semiconductor layer comprises one or more materials selected from the group consisting of Ge, GaAs, InP, GaN, and combinations thereof.

19. A method of forming a semiconductor device comprising:
providing a template layer on a substrate, the template layer comprising a top surface;
exposing the template layer to a semiconductor material to form a plurality of nanoscale windows through the template layer to expose a plurality of portions of the substrate, and to subsequently form a plurality of semiconductor islands in each one of the plurality of nanoscale windows on a corresponding portion of the substrate;
continuing the exposure to the semiconductor material to grow each semiconductor island of the plurality of semiconductor islands to cover a portion of the top surface of the template layer;
annealing the plurality of semiconductor islands at a temperature of at least about 900 K prior to coalescence of the plurality of the semiconductor islands into a continuous semiconductor layer, wherein an uncovered portion of the template layer is removed to expose a second portion of the substrate;
forming an interfacial layer on the exposed second portion of the substrate; and
laterally growing the plurality of semiconductor islands into the continuous semiconductor layer to cover the interface layer, wherein the continuous semiconductor layer is formed with reduced stacking faults and threading dislocations.

20. The method of claim 19, wherein
the substrate is Si;
each of the semiconductor layer and the plurality semiconductor islands is formed of a material comprising Ge, GaAs, InP, or GaN;
the template layer is formed of a material comprising silicon oxide, silicon nitride, silicon oxynitride, or anodized aluminum oxide (AAO); and
the interfacial layer is formed of a material comprising $SiO_2$.

* * * * *